United States Patent [19]

Kameya

[11] Patent Number: 4,695,812

[45] Date of Patent: Sep. 22, 1987

[54] ELECTROMAGNETIC DELAY LINE WITH INDUCTANCE ELEMENT WITH TRANSVERSELY STAGGERED STACKED CONDUCTING PORTIONS

[75] Inventor: Kazuo Kameya, Tsurugashima, Japan

[73] Assignee: Elmec Corporation, Saitama, Japan

[21] Appl. No.: 839,578

[22] Filed: Mar. 14, 1986

[30] Foreign Application Priority Data

Mar. 15, 1985 [JP] Japan .................................. 60-52670
Jul. 9, 1985 [JP] Japan ................................ 60-151488

[51] Int. Cl.[4] .......................... H01P 9/00; H03H 7/34

[52] U.S. Cl. .................................... 333/156; 333/139; 333/140; 333/245

[58] Field of Search ........ 333/156, 161, 162, 138–140, 333/239, 240, 20, 23, 245; 336/69, 186–187, 223, 225, 232

[56] References Cited

U.S. PATENT DOCUMENTS

| | | | |
|---|---|---|---|
| 2,462,410 | 2/1949 | Lindenblad | 333/23 X |
| 3,543,194 | 11/1970 | Kassabgi | 333/156 |
| 3,609,600 | 9/1971 | Kassabgi | 333/156 |

*Primary Examiner*—Marvin L. Nussbaum
*Attorney, Agent, or Firm*—Wegner & Bretschneider

[57] ABSTRACT

This distributed constant type delay line has an inductance element which has a plurality of main portions lying generally in parallel stacked planes. Each of the main portions has a conducting portion with a generally central line, the conducting portions being connected in series with one another with their the central lines lying generally parallel to one another and being alternately staggered to and fro in the direction generally perpendicular to them and generally parallel to the stacked planes. A ground electrode is interposed between the conducting portions of two neighboring ones of the main portions of the inductance element. And a dielectric layer is interposed between the ground electrode and a neighboring one of the main portions of the inductance element. Thereby, a very efficient and compact construction becomes available, which is suitable for being made as a chip. Optionally, capacitance compensating electrodes are defined as extending out from the main portions of the inductance element.

21 Claims, 17 Drawing Figures

ELECTROMAGNETIC DELAY LINE WITH INDUCTANCE ELEMENT WITH TRANSVERSELY STAGGERED STACKED CONDUCTING PORTIONS

BACKGROUND OF THE INVENTION

The present invention relates to the field of distributed constant type electromagnetic delay lines and more specifically relates to a super high speed such distributed constant type electromagnetic delay line which is suitable for handling a super high speed signal having a rise time of 1 ns or less, and which is of a super compact type construction which is suitable to be formed as a chip.

Conventionally, there is a known sort of distributed constant type electromagnetic delay line, in which a zigzag strip, in the form of a bent over microstrip line, is formed over a major surface of a dielectric plate, whose other surface is provided with a ground electrode. However, such a conventional type of distributed constant electromagnetic delay line suffers from the disadvantage that there is an excessive negative coupling between the bent line intervals, and this sets a limit to the compactness of the design and impairs the characteristics of the distributed constant electromagnetic delay line as far as handling super high speed signals is concerned.

Therefore, the present inventor previously proposed a novel type of distributed constant electromagnetic delay line in U.S. patent application Ser. No. 686,399 which has now issued as U.S. Pat. No. 4,570,136; it is not intended hereby to admit this prior proposal as prior art to the present application except to the extent otherwise prescribed by law. In this prior proposal, in a distributed constant electromagnetic delay line in which a zigzag strip and a ground electrode oppose one another with a dielectric body interposed therebetween, the zigzag strip was bent over first and second imaginary planes which opposed one another with a spacing of T therebetween, in an alternating manner at a pitch of P, with the spacing T and the pitch P being selected so that the ratio T/P was between zero and unity, so that as a consequence the negative coupling arising from the zigzag strip line is appropriately reduced or canceled, and so that super compact design and improvement in electronic properties are obtained.

However, the distributed constant electromagnetic delay line of this above identified proposal was not yet perfect from the point of view of compactness and manufacturing convenience, and its electronic properties were not yet ideal.

SUMMARY OF THE INVENTION

Accordingly, it is the primary object of the present invention to provide a distributed constant type delay line, which avoids the above described problems.

It is a further object of the present invention to provide such a distributed constant type delay line, which is suitable for being made in a very compact form.

It is a further object of the present invention to provide such a distributed constant type delay line, which is suitable for being manufactured in chip form.

It is a further object of the present invention to provide such a distributed constant type delay line, which has a desirably high capacitance.

It is a yet further object of the present invention to provide such a distributed constant type delay line, which has appropriate characteristics in the super high frequency operational area.

It is a yet further object of the present invention to provide such a distributed constant type delay line, which can operate with relatively small losses.

It is a yet further object of the present invention to provide such a distributed constant type delay line, which has good pulse response properties.

According to the present invention, these and other objects are accomplished by a distributed constant type delay line, comprising: (a) an inductance element comprising a plurality of main portions lying generally in parallel stacked planes, each said main portion comprising a conducting portion with a generally central line, said conducting portions being connected in series with one another with their said central lines lying generally parallel to one another and being alternately staggered to and fro in the direction generally perpendicular to them and generally parallel to said stacked planes; (b) a ground electrode interposed between said conducting portios of two neighboring ones of said main portions of said inductance element; and: (c) a dielectric layer interposed between said ground electrode and a neighboring one of said main portions of said inductance element; or alternatively by a distributed constant type delay line, comprising: (a) an inductance element comprising a plurality of main portions lying generally in parallel stacked planes, each said main portion comprising a conducting portion with a generally central line, said conducting portions being connected in series with one another at end portions thereof with their said central lines lying generally parallel to one another and being alternately staggered to and fro in the direction generally perpendicular to them and generally parallel to said stacked planes; (b) a ground electrode interposed between said conducting portions of two neighboring ones of said main portions of said inductance element; (c) a dielectric layer interposed between said ground electrode and a neighboring one of said main portions of said inductance element; and: (d) a capacitance compensating electrode fixed to said neighboring one of said main portions of said inductance element and opposing said ground electrode with said dielectric layer therebetween.

According to the present invention as defined above, since the conducting portions are connected in series with one another at end portions thereof with their said central lines lying generally parallel to one another and are alternately staggered to and fro in the direction generally perpendicular to them and generally parallel to said stacked planes, thereby an inductance element is constituted which is electronically equivalent to a solenoid wound of conductive wire, as will be explained in more detail in the following. Thereby, a distributed constant type delay line is constituted by the ground electrode opposing the inductance element with the dielectric body interposed between them; and this construction is particularly suitable for compact construction, as for example in the form of a chip.

BRIEF DESCRIPTION OF THE DRAWINGS

The present invention will now be shown and described with regard to certain of the preferred embodiments thereof, and with reference to the illustrative drawings, which however should not be considered as limitative of the present invention in any way. In these drawings.

DESCRIPTION OF THE PREFERRED EMBODIMENTS

Figure 1:
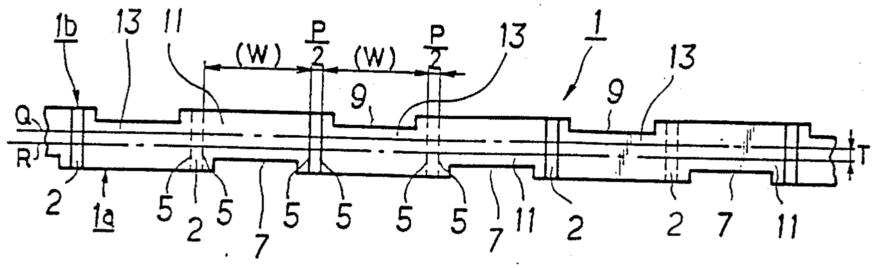
FIG. 1 shows an inductance element which is an important portion of the first preferred embodiment of the electromagnetic delay line of the present invention in unfolded and flattened out form.
Figure 2:
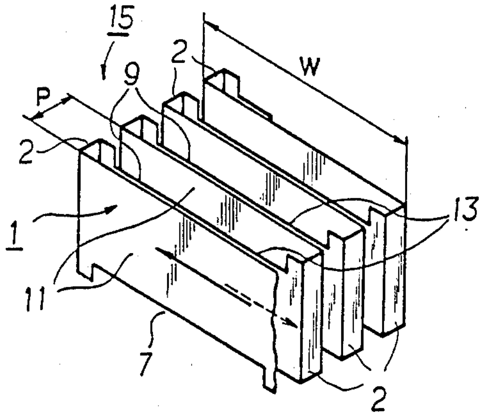
FIG. 2 is a perspective view of said inductance element as folded up into its completed configuration which is a zigzag shape.

The present invention will now be described with reference to the preferred embodiments thereof. FIGS. 1 and 2 respectively show in unfolded and flattened view and in perspective view an inductance element which is incorporated into the first preferred embodiment of the present invention, said first preferred embodiment itself being shown in FIGS. 4 through 6. In these figures, the reference numeral 1 denotes a thin and elongated ribbon line, which is conductive and for example may be made of a metal such as thin copper plate or foil or the like, and this ribbon line 1 is folded to and fro into an accordion shape to constitute the finished aforesaid inductance element 15.

In more detail, the ribbon line 1 is initially of course prepared in its unfolded and flattened state of FIG. 1, and is afterwards bent. This ribbon line 1 is made up from a series of conjoined and integrally formed unit ribbon elements 11 and 13, arranged alternatingly and joined together by intermediate connection portions 2 which are formed as rectangles which are relatively short along the longitudinal direction of the ribbon line 1. The one set of these unit ribbon elements 11 are formed with elongated cut out portions 7 on those ones of their long edges which are located on the one side of the ribbon line 1 (the bottom edge 1*a* thereof in FIG. 1), while the other set of unit ribbon elements 13 are formed with similar elongated cut out portions 9 on those ones of their long edges which are located on the other side of the ribbon line 1 (the top edge 1*b* thereof in FIG. 1). The rectangular intermediate connection portions 2 are connected between adjoining ones of the unit ribbon elements 11 and 13 at folds 5, which are right angled folds and the directions of which are alternated in pairs, so that, taking the fold 5 between a typical unit ribbon element 11 and one edge of an intermediate connection portion 2 connected to one of its ends as being in a certain direction: the fold 5 between the opposite edge of said intermediate connection portion 2 and the one end of the unit ribbon element 13 connected to it is in the same certain direction; the fold 5 between the other end of said unit ribbon element 13 and the edge of the next intermediate connection portion 2 connected to it is in the opposite direction to said certain direction; the fold 5 between the opposite edge of said next intermediate connection portion 2 and the one end of the next unit ribbon element 11 connected to it is in the same opposite direction to said certain direction; and so on along the ribbon line 1.

Figure 3:
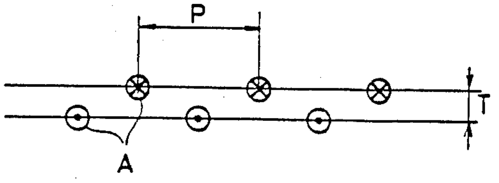
FIG. 3 is a schematic diagram for suggesting the make up of a coil which is electronically equivalent to said inductance element of FIGS. 1 and 2, this figure being applicable to all of the preferred embodiments of the present invention which will be disclosed.

Thus, denoting the common length of the unit ribbon elements 11 and 13 by "W" and denoting the width (extent in the longitudinal direction of the ribbon line 1) of each of the intermediate connection portions 2 by "P/2", with reference to FIG. 1, it is seen that there is thus formed an inductance element generally denoted as 15 of width W and pitch P constituted as the series connection of the unit ribbon elements 11 and 13 arranged alternatingly in a zigzag fashion substantially parallel to one another so as to provide mutual inductance, and with the cut out portions 9 being located on its one side (the upper side in FIG. 2) alternatingly with non cut away portions, while similarly the cut out portions 7 are located on its other side (the lower side in FIG. 2) alternatingly with non cut away portions. And then the respective longitudinal center lines Q and R of the unit ribbon elements 11 and 13 are spaced apart by a distance of T in the transverse direction to the ribbon line 1, as indicated in FIG. 1. Thus, if electric current is flowed through this inductance element 15 in the direction indicated in FIG. 2 by the arrow the electronic effect is equivalent to that of an inductance element constituted by a conductive wire element A being wound in a spaced manner into a single layer solenoid with a pitch of P and a spacing of T, as schematically shown in FIG. 3.

Figure 4:
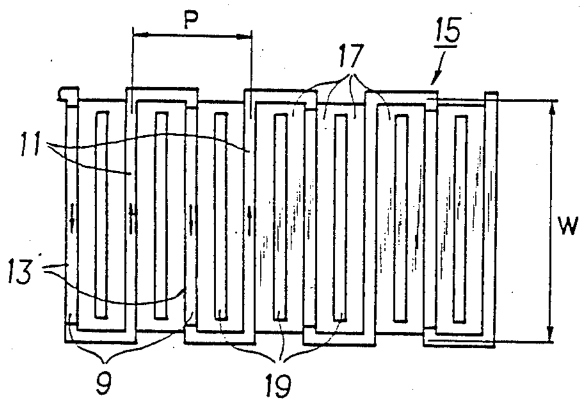
FIG. 4 is a plan view of the first preferred embodiment of the electromagnetic delay line of the present invention, which incorporates the inductance element of FIGS. 1 and 2.
Figure 5:
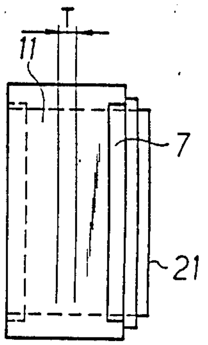
FIG. 5 is a side view of said first preferred embodiment electromagnetic delay line of FIG. 4.
Figure 6:
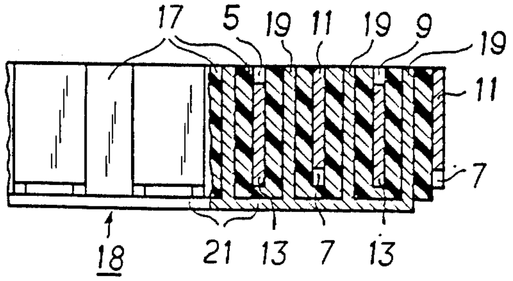
FIG. 6 is a partly sectional frontal view of said first preferred embodiment electromagnetic delay line of FIGS. 4 and 5.

Now, the first preferred embodiment of the electromagnetic delay line of the present invention will be described, with reference to FIGS. 4 through 6. This electromagnetic delay line is built around the inductance element 15 described above, and further comprises a ground electrode assembly 18, which is made of a plurality of ground electrodes 19 mounted as extending substantially perpendicular from a ground electrode base plate 21. As best shown in the part sectional frontal view of FIG. 6, one of said ground electrodes 19 is fitted in between each of the pairs of adjoining unit ribbon elements 11 and 13 of the inductance element 15, and around each of said unit ribbon elements 11 and 13 there is fitted an envelope shaped dielectric body 17, which may be for instance made of fluoride resin. The whole construction makes up a solid and tightly layered sandwich assembly, with a flat sheet of dielectric being part of one of the dielectric bodies 17 being layered in between each adjoining pair consisting of a unit ribbon element 11 or 13 and a ground electrode 19 extending substantially parallel thereto at a relatively short distance away therefrom, said dielectric sheet ensuring electrical isolation between said unit ribbon element 11 or 13 and said ground electrode 19 while desirably increasing the capacitance therebetween. Thus, a distributed constant type electromagnetic delay line is constituted.

With regard to this distributed constant type electromagnetic delay line, since the sets of unit ribbon elements 11 and 13, the dielectric bodies 17, and the ground electrodes 19 are all laminated or layered together, it is very compact and is suitable to be formed as a chip. By appropriately selecting the relationship between the spacing T, the width W, and the pitch P, defined above with respect to the inductance element 15 in FIGS. 1 and 2, an improvement of pulse response properties becomes available, and compact design becomes easy. Specifically, by adjusting the depth of the cut out portions 7 and 9 of the respective unit ribbon elements 11 and 13, the length W of each of said unit ribbon elements 11 and 13, and the width P/2 of the intermediate connection portions 2, desirable electronic characteristics can be attained. And, since any of these three dimensions can be varied between very wide limits, great flexibility is available in the tailoring of the performance of the electronic delay line.

One of the features of this electronic delay line is that, since the facing area between each of the ground electrodes 19 and the confronting unit ribbon elements 11 and 13 can be kept broad even when the values of the pitch P and the spacing T are made relatively small, a sufficient electrostatic capacitance is easily assured, even when the dimensions of the device as a whole are made to be small. Furthermore, since both the surfaces of each of said ground electrodes 19 and each of said unit ribbon elements 11 and 13 contribute to forming the capacitance of the final assembly, favorable efficiency is obtained.

When the pitch P of the inductance element 15 is reduced, the thickness as a whole of said inductance element 15 diminishes, which is very helpful for the purpose of obtaining super compact design. Also, the thicknesses of the dielectric bodies 17 are concomitantly decreased, which desirably further increases the capacitance. Further, since the cross sections of the conductive bodies in the inductance element 15 can be kept large, the overall losses can be kept to a low level. In particular, with regard to operation in the super high frequency range, the fact that the conductive bodies composing the inductance element 15 are planar is preferable from the point of view of reduction of losses.

Thus, according to this first preferred embodiment of the present invention, there is provided a distributed constant type electromagnetic delay line which is very suitable for being made as a chip, and which has a small loss and good pulse response properties.

Figure 7:
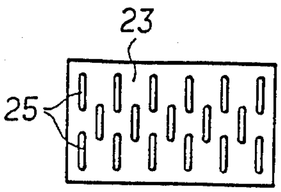
FIG. 7 shows an alternative construction for the ground electrodes utilized in a second preferred embodiment of the electromagnetic delay line of the present invention.
Figure 8:
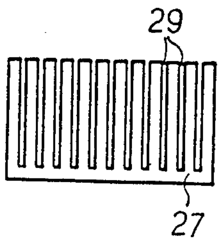
FIG. 8 shows a variation of said ground electrode construction for said second preferred embodiment electromagnetic delay line.

Now, with reference to FIGS. 7 and 8, two possibilities for a second preferred embodiment of the distributed constant type electromagnetic delay line of the present invention will be described. In this second preferred embodiment, each of the ground electrodes 19 is formed, not as a simple plate structure, but with removed portions. Thus, in the FIG. 7 variation, each of the ground electrodes 23 is formed with a plurality of fine parallel short slits 25 formed in it, so as to increase the total characteristic impedance by reducing the confronting areas of said ground electrodes 23 and the respectively opposed unit ribbon elements 11 and 13. This may be desirable since the total characteristic impedance could otherwise undesirably be caused to drop to lower than a target level. And, as an alternative construction with the same rationale, each of the ground electrodes 27 can be formed in a comb shape with a plurality of fine parallel long slits 29 formed in it from its base portion to open at its other edge. This construction provides the same advantages and merits as the FIG. 7 construction.

Figure 9:
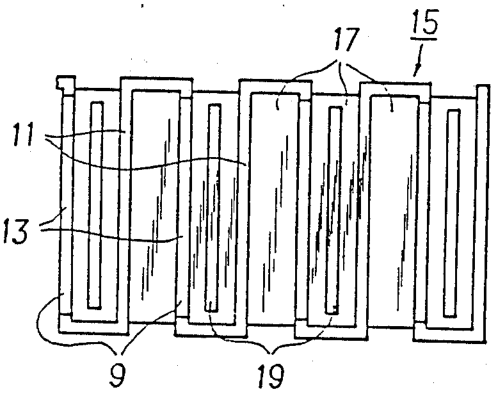
FIG. 9 is a plan view, similar to FIG. 4 for the first preferred embodiment, showing the third preferred embodiment of the electromagnetic delay line of the present invention.

Now, a third preferred embodiment of the distributed constant type electromagnetic delay line of the present invention will be described, with reference to FIG. 9 which is a plan view similar to FIG. 4 for the first preferred embodiment. In this third preferred embodiment as contrasted to the first preferred embodiment every second one of the ground electrodes 19 is omitted, so that only one of the surfaces of each of the unit ribbon elements 11 and 13 is opposed to such a ground electrode 19 with a layer of dielectric material 17 between them; the other surface of each of the unit ribbon elements 11 and 13 is opposed to the other surface of the neighboring one of the unit ribbon elements 13 or 11 respectively at a greater distance therefrom with a thicker and solid layer of dielectric 17 between them. According to this third preferred embodiment of the present invention, since the confronting area between the unit ribbon elements 11 and 13 and the ground electrodes 19 is as a whole reduced, again the capacitance is reduced. Accordingly this third preferred embodiment is convenient for utilization in circumstances when the capacitance tends to become greater than desired.

Figure 10:
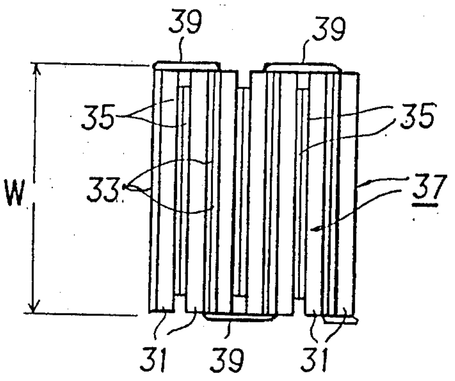
FIG. 10 is a plan view, similar to FIGS. 4 and 9 for the first and third preferred embodiments, showing the fourth preferred embodiment of the electromagnetic delay line of the present invention.

Now, a fourth preferred embodiment of the distributed constant type electromagnetic delay line of the present invention will be described, with reference to FIG. 10. In this fourth preferred embodiment, as contrasted to the previously described preferred embodiments, the inductance element is not formed by folding a single ribbon line such as the ribbon line 1 of FIG. 1, but instead said inductance element is built up by connecting together a number of subelements. In detail, a number of unit dielectric bodies 31 formed as plates are utilized, and on one surface of each a unit ribbon element 33 having a length of W is formed by plating or the like, while on the opposite surface of each said unit dielectric body 31 a ground electrode 35 the length of which is somewhat shorter than W is formed; thereby, a basic assembly unit 37 is defined. A number of these assembly units 37 are then assembled back to back as illustrated in FIG. 10, with pairs of the ground electrodes 35 abutted to one another alternated with pairs of the unit ribbon elements 33 abutted to one another, and with the interposition of layers of dielectric therebetween. As described with respect to the first preferred embodiment, alternate ones of the pairs of the unit ribbon elements 33 are mutually staggered with respect to one another by an amount T in the direction perpendicular to the drawing paper in FIG. 10, although this is not visible in the figure. And alternate pairs of the pairs of unit ribbon elements 33 abutted to one another are connected together by means such as non electrolytic plating at connection portions 39 as shown in the figure, so as to achieve an electrically equivalent construction to that of the first preferred embodiment. Further, although it is not so shown in the figure, the pairs of ground electrodes 33 should all be mutually connected together and led to a ground.

Thus, it is seen that the electromagnetic delay line of the present invention is not to be conceived of as being limited to those such as the first through the third preferred embodiments described above in which a ribbon line is bent to and fro so as to integrally form the unit ribbon elements of the impedance element, but on the contrary as shown in this fourth preferred embodiment the impedance element may be built up by laminating separate ribbon elements together and connecting them appropriately. As a constructional example of this sort of electromagnetic delay line, although such is not particularly shown in the drawings, it is possible to laminate together ceramic plates which serve as dielectric bodies, on which conductors for serving as the unit ribbon elements are coated by means such as plating, and to then bake said ceramic plates together into an integral body, by a method which may be a modified application of the process for making chip type laminated ceramic capacitors. Furthermore, it is also possible to alternatingly laminate together the unit ribbon elements, the dielectric bodies, and the ground electrodes, and then to connect said unit ribbon elements at their end portions in series and to connect the ground electrodes together in common, among other possibilities.

Figure 11:
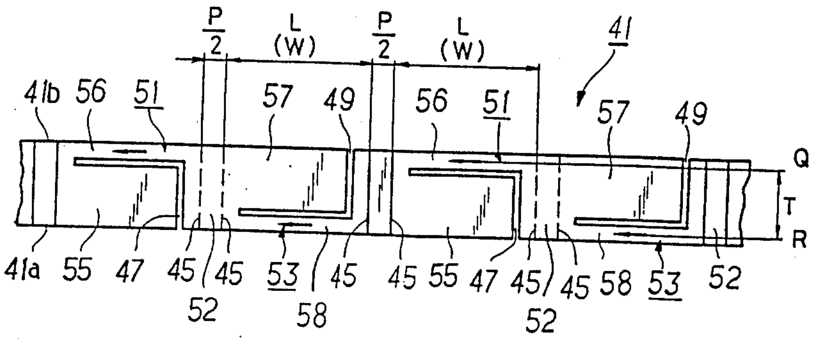
FIG. 11 is similar to FIG. 1, and shows an inductance element which is an important portion of the fifth preferred embodiment of the electromagnetic delay line of the present invention, in unfolded and flattened out form.
Figure 12:
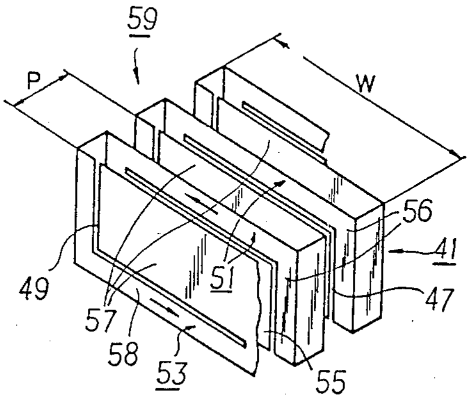
FIG. 12 is similar to FIG. 2, being a perspective view of said inductance element as folded up into its completed configuration which is a zigzag shape.

Now, a fifth preferred embodiment of the distributed constant type electromagnetic delay line of the present invention will be described, with reference to FIGS. 11 through 15. In the description of this fifth preferred embodiment, as in that of the first preferred embodiment, first the inductance element 59 thereof will be described. FIGS. 11 and 12 respectively show said inductance element 59 in unfolded and flattened view and in perspective view. In these figures, the reference numeral 41 denotes a thin and elongated ribbon line, which is conductive and for example may be made of a metal such as thin copper plate or foil or the like, and this ribbon line 41 is folded to and fro into an accordion shape to constitute the finished aforesaid inductance element 59.

In more detail, the ribbon line 41 is initially of course prepared in its unfolded and flattened state as shown in FIG. 11 and is afterwards bent. This ribbon line 41 is made up from a series of conjoined and integrally formed unit ribbon elements 51 and 53, arranged alternatingly and joined together by intermediate connection portions 52 which are formed as rectangles which are relatively short along the longitudinal direction of the ribbon line 41. The one set of these unit ribbon elements 51 are formed with L shaped slots 47 extending from those ones of their long edges which are located on the one side of the ribbon line 41 (the bottom edge 41*a* thereof in FIG. 11), while the other set of unit ribbon elements 53 are formed with similar L shaped slots 49 extending from those ones of their long edges which are located on the other side of the ribbon line 41 (the top edge 41*b* thereof in FIG. 11). Each of these L shaped slots extends from the long edge of its unit ribbon element to which it opens almost to the other edge thereof, then to turn and run along parallel to said other edge over its major extent, all in the same direction along the longitudinal direction of the ribbon line 41. Thereby, each of the unit ribbon elements 51 is divided by the L shaped slot 47 cut therein into a flap portion 55 and an L shaped conducting portion 56; and, similarly, each of the unit ribbon elements 53 is divided by the L shaped slot 49 cut therein into a flap portion 57 and an L shaped conducting portion 58. The rectangular intermediate connection portions 52 are connected between adjoining ones of the unit ribbon elements 51 and 53 at folds 45, which as in the case of the first preferred embodiment are right angled folds and the directions of which are alternated in pairs; so that, taking the fold 45 between a typical unit ribbon element 51 and one ege of an intermediate connection portion 52 connected to one of its ends as being in a certain direction: the fold 45 between the opposite edge of said intermediate connection portion 52 and the one end of the unit ribbon element 53 connected to it is in the same certain direction; the fold 45 between the other end of said unit ribbon element 53 and the edge of the next intermediate connection portion 52 connected to it is in the opposite direction to said certain direction; the fold 45 between the opposite edge of said next intermediate connection portion 52 and the one end of the next unit ribbon element 51 connected to it is in the same opposite direction to said certain direction; and so on along the ribbon line 41.

Thus, denoting the common length of the unit ribbon elements 51 and 53 by "W" and denoting the width (extent in the longitudinal direction of the ribbon line 41) of each of the intermediate connection portions 52 by "P/2", with reference to FIG. 12, it is seen that there is thus formed an inductance element generally denoted as 59 of width W and pitch P constituted as the series connection of the respective L shaped conducting portions 56 and 58 of the unit ribbon elements 51 and 53 arranged alternatingly in a zigzag fashion substantially parallel to one another but mutally staggered with respect to one another in the vertical direction in FIG. 12 so as to provide mutual inductance, and with the L shaped conducting portions 56 being located on its one side (the upper side in FIG. 12) alternatingly with the flap portions 57, while similarly the L shaped conducting portions 58 are located on its other side (the lower side in FIG. 12) alternatingly with the flap portions 55. And, denoting the offset distance between the respective longitudinal center lines Q and R of the portions of the L shaped conducting portions 56 and 58 which extend parallel to the longitudinal direction of the ribbon line 41 as "T" as shown in FIG. 11, then, if electric current is flowed through this inductance element 59 in the direction indicated in FIGS. 11 and 12 by the arrow, the electronic effect is equivalent to that of an inductance element constituted by a conductive wire element A being wound in a spaced manner into a single layer solenoid with a pitch of P and a spacing of T, as schematically shown in FIG. 3 which logically applies to this inductance element 59 for the fifth preferred embodiment as well as to that one for the first preferred embodiment.

Figure 13:
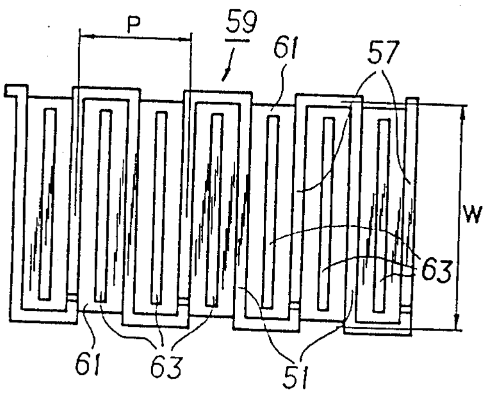
FIG. 13 is similar to FIG. 4, being a plan view of the fifth preferred embodiment of the electromagnetic delay line of the present invention, which incorporates the inductance element of FIGS. 11 and 12.
Figure 14:
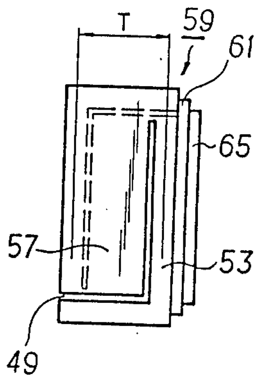
FIG. 14 is similar to FIG. 5, being a side view of said fifth preferred embodiment electromagnetic delay line of FIG. 13.
Figure 15:
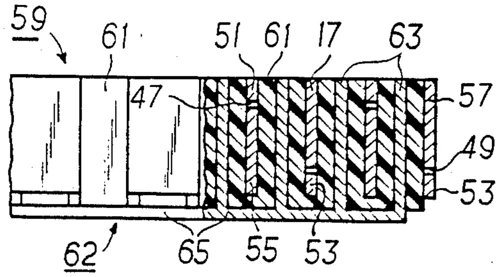
FIG. 15 is similar to FIG. 6, being a partly sectional frontal view of said fifth preferred embodiment electromagnetic delay line of FIGS. 13 and 14.

Now, the fifth preferred embodiment of the electromagnetic delay line of the present invention will be described, with reference to FIGS. 13 through 15. This electromagnetic delay line is built around the inductance element 59 described above, and further comprises a gound electrode assembly 62, which is made of a plurality of ground electrodes 63 mounted as extending substantially perpendicular from a ground electrode base plate 65. As best shown in the part sectional frontal view of FIG. 15, one of said ground electrodes 63 is fitted in between each of the pairs of adjoining unit ribbon elements 51 and 53 of the inductance element 59, and around each of said ground electrodes 63 there is fitted an envelope shaped dielectric body 61, which may again be for instance made of fluoride resin. The whole construction again makes up a solid and tightly layered sandwich assembly, with a flat sheet of dielectric being part of one of the dielectric bodies 61 being layered in between each adjoining pair consisting of a unit ribbon element 51 or 53 and a ground electrode 63 extending substantially parallel thereto at a relatively short distance away therefrom, said dielectric sheet ensuring electrical isolation between said unit ribbon element 51 or 53 and said ground electrode 63 while desirably increasing the capacitance therebetween. Thus, a distributed constant type electromagnetic delay line is constituted. And the flap portions 55 and 57 respectively of the unit ribbon elements 51 and 53 act as capacitance compensating electrodes in cooperation with the ground electrodes 63 which they oppose.

As before, this distributed constant type electromagnetic delay line according to the fifth preferred embodiment of the present invention is very compact and is suitable to be formed as a chip, since the sets of unit ribbon elements 51 and 53, the dielectric bodies 61, and the ground electrodes 63 are all laminated or layered together. Again, by appropriately selecting the relationship between the spacing T, the width W, and the pitch P, defined above with respect to the inductance element 59 in FIGS. 11 and 12, good pulse response properties become available and compact design becomes easy. Specifically, by adjusting the parameter T defined with respect to the flap portions 55 and 57, the length W of each of the unit ribbon elements 51 and 53, and the width P/2 of the intermediate connection portions 52, desirable electronic characteristics can be attained. Again, since any of these three dimensions can be varied between very wide limits, great flexibility is available in the tailoring of the performance of the electronic delay line. When the pitch P of the inductance element 59 is reduced, the thickness as a whole of said inductance element 59 diminishes, which is very helpful for the purpose of obtaining super compact design, and the thicknesses of the dielectric bodies 61 are decreased, which increases the capacitance. In particular, with regard to operation in the super high frequency range, the fact that the conductive bodies composing the inductance element 59 are planar is again preferable from the point of view of reduction of losses. Thus, according to this fifth preferred embodiment of the present invention, again there is provided a distributed constant type electromagnetic delay line which is very suitable for being made as a chip, and which has a small loss and good pulse response properties.

One of the features of this particular fifth preferred embodiment of the electronic delay line of the present invention is that, since as the width of the L shaped conducting portions 56 and 58 of the unit ribbon elements 51 and 53 is reduced the inductance for each unit length increases, while at the same time there is some addition to the capacitace on account of the concomitant increase in size of the flap portions 55 and 57, therefore the delay time provided by each unit length of the unit ribbon elements 51 and 53 increases. As the width of the L shaped conducting portions 56 and 58 is reduced, their capacitance is reduced, but the flap portions 55 and 57 at least partially compensate for this by increasing the capacitance. Therefore, it is simple to increase both the inductive and the capacitive components of each of the unit ribbon elements 51 and 53, thereby to increase the delay time. Since the characteristic impedance Zo of each of the unit ribbon elements 51 and 53 is determined by $Zo=\sqrt{L/C}$, wherein the symbols L and C respectively denote the inductance component for each unit length of the unit ribbon elements 51 and 53, and the electrosttic capacitance for each said unit length of the unit ribbon elements 51 and 53 after an averaging including the capacitance compensating electrodes constituted by the flap portions 55 and 57, therefore it is simple to increase said characteristic impedance Zo.

It is also possible to compensate more static capacitance than is lacking in the unit ribbon elements 51 and 53, by means of the flap portions 55 and 57, by further reducing the widths of the L shaped conducting portions 56 and 58 of said unit ribbon elements 51 and 53, for instance by increasing the cut in depth of the slots 47 and 49 and thus increasing the size of said flap portions 55 and 57, and in such a case even longer delay times can be obtained. In this respect, in the first through the fourth preferred embodiments of the present invention described above, both the inductance and the capacitance components of the unit ribbon elements 51 and 53 were dependent upon their width, and thus said inductance and capacitance components could not be varied independently; but by contrast in this fifth preferred embodiment the freedom of design becomes greater, since the widths of the L shaped conducting portions 56 and 58 of the unit ribbon elements 51 and 53 can be altered independently of the area which contributes to the capacitance component.

If the capacitance tends excessively to increase, then it is possible to reduce the areas of the confronting surfaces of the unit ribbon elements 51 and 53 and the ground electrodes 63, for instance by forming slits in said ground electrodes as was done in the case of the second preferred embodiment; and it is possible to eliminate every second one of said ground electrodes 63, as was done in the case of the third preferred embodiment.

Figure 16:
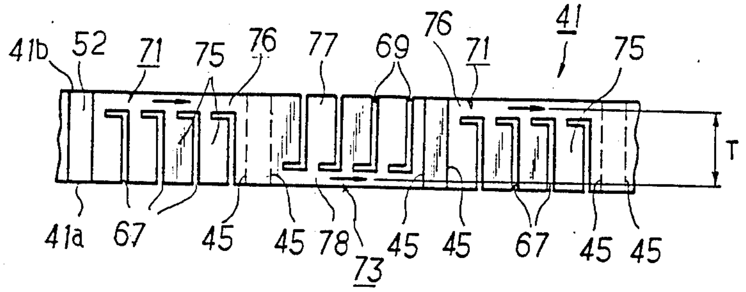
FIG. 16 is a plan view, similar to FIGS. 1 and 11 for the first and fifth preferred embodiments of the present invention respectively, of an inductance element of a sixth preferred embodiment of the present invention, shown in unfolded and flattened out form.

Now, a sixth preferred embodiment of the distributed constant type electromagentic delay line of the present invention will be described, with reference to FIG. 16. In this sixth preferred embodiment, as contrasted to the fifth preferred embodiment, the inductance element ribbon line if formed with, in each one of each of the sets of unit ribbon elements herein designated as 71 and 73 (which as before are alternated along the ribbon line 41), a plurality (four in the shown example) of L shaped slots 67 or 69 respectively being formed as extending from one of its long edges. Each of these L shaped slots 67 and 69, as before, extends from the long edge of its unit ribbon element to which it opens almost to the other edge thereof, then to turn and run along parallel to said other edge for a certain relatively short distance, all in the same direction along the longitudinal direction of the ribbon line 41. Thereby, each of the unit ribbon elements 71 and 73 is divided by the L shaped slots 67 or 69 cut therein into a plurality (herein four) of flap portions 75 or 77 and an L shaped conducting portion 76 or 78, respectively. Thus, as before, these flap portions 75 and 77, when the ribbon line 41 is folded up into an accordion shape and is incorporated into a distributed constant type delay line as was done with the other preferred embodiments described above, as before constitute capacitance compensating electrodes in cooperation with the ground electrodes (not shown) which they oppose. And, as before, this distributed constant type electromagnetic delay line according to the sixth preferred embodiment of the present invention is very compact and is suitable to be formed as a chip. Again, by appropriately selecting the relationship between the spacing, the width, and the pitch of the unit ribbon elements 71 and 73, etc., good pulse response properties become available and compact design becomes easy. Thus, according to this sixth preferred embodiment of the present invention, again there is provided a distributed constant type electromagnetic delay line which is very suitable for being made as a chip, and which has a small loss and good pulse response properties.

Figure 17:
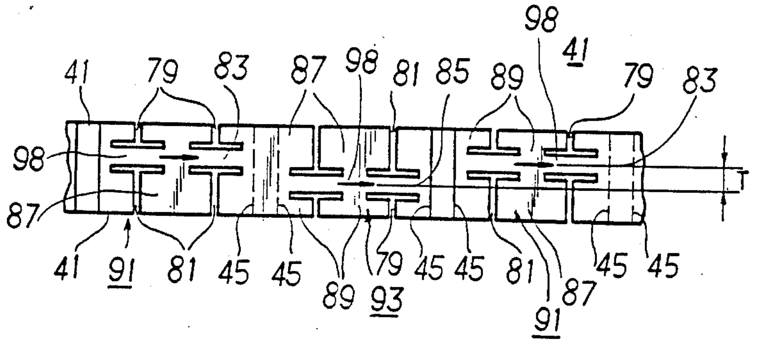
FIG. 17 is a plan view, similar to FIGS. 1, 11, and 16 for the first, fifth, and sixth preferred embodiments of the present invention respectively, of an inductance element of a seventh preferred embodiment of the present invention, again shown in unfolded and flattened out form.

Now, a seventh preferred embodiment of the distributed constant type electromagnetic delay line of the present invention will be described, with reference to FIG. 17. In this seventh preferred embodiment, as contrasted to the previously described preferred embodiments, the inductance element ribbon line is formed as follows. The one set of the unit ribbon elements 91 are formed with relatively short T shaped slots 79 extending from those ones of their long edges which are located on the one side of the ribbon line 41 (the top edge 41*b* thereof in FIG. 17) and with similar but longer T shaped slots 81 extending from those ones of their long edges which are located on the other side of the ribbon line 41 (the bottom edge 41*a* thereof in FIG. 17), while the other set of unit ribbon elements 93 (which as before are alternated with the unit ribbon elements 91 along the ribbon line 41) are formed in the reverse manner, with similar shorter T shaped slots 79 extending from those ones of their long edges which are located on said other side of the ribbon line 41 (the bottom edge 41*a* thereof in FIG. 17) and with similar longer T shaped slots 81 extending from those ones of their long edges which are located on the other side of the ribbon line 41 (the top edge 41*b* thereof in FIG. 17). The vertical of each of these T shaped slots 79 and 81 extends from the long edge of its unit ribbon element to which it opens only part way across it, for its crossbar then to run along parallel to said other edge for a certain distance. Thereby, each of the unit ribbon elements 91 and 93 is divided by the T shaped slots 79 and 81 cut therein into larger flap portions 87, shorter flap portions 89, and a generally centrally located conducting portion 98; and the dimension T defined with regard to the inductance elements of the other preferred embodiments described above is in this inductance element for the seventh preferred embodiment defined as the offset between the parallel central longitudinal lines of adjacent ones of said conducting portions 98. As before, these flap portions 87 and 89, when the ribbon line 41 is folded up into an accordion shape and is incorporated into a distributed constant type delay line as was done with the other preferred embodiments described above, as before constitute capacitance compensating electrodes in cooperation with the ground electrodes (not shown) which they oppose. And, as before, this distributed constant type electromagnetic delay line according to the seventh preferred embodiment of the present invention is very compact and is suitable to be formed as a chip, and, by appropriately selecting the relationship between the spacing, the width, and the pitch of the unit ribbon elements 91 and 93, etc., good pulse response properties become available and compact design becomes easy. Thus, according to this seventh preferred embodiment of the present invention, gain there is provided a distributed constant type electromagnetic delay line which is very suitable for being made as a chip, and which has a small loss and good pulse response properties.

Although the present invention has been shown and described in terms of certain preferred embodiments thereof, and with reference to the appended drawings, it should not be considered as being particularly limited thereby. Accordingly, the scope of the present invention is to be considered as being delimited, not by any particular perhaps entirely fortuitous details of the disclosed preferred embodiments, or of the drawings, but solely by the legitimate and properly interpreted scope of the accompanying claims.

What is claimed is:

1. A distributed constant type delay line, comprising:

(a) an inductance element comprising a plurality of essentially parallel stacked plates which are conducting and connected in series, said stacked plates being defined by a first and a second set of plates, individual plates of said first set of plates being stacked to alternate with individual plates of said second set of plates, each of said stacked plates having a longitudinal axis, the longitudinal axes of the first set of plates defining a first plane essentially perpendicular to the parallel stacked plates, the longitudinal axes of the second set of plates defining a second plane essentially perpendicular to the parallel stacked plates, said first plane being spaced from said second plane;

(b) a ground electrode interposed between adjacent parallel stacked plates; and (c) a dielectric layer interposed between said ground electrode and said parallel stacked plates.

2. A delay line as claimed in claim 1, wherein said inductance element is formed from an elongated conducting strip having a longitudinal axis and comprising conducting portions and connecting portions, said strip being folded along lines essentially perpendicular to the longitudinal axis of said strip between the conducting portions and the connection portions, so that said conducting portions form said parallel stacked plates, and said connecting portions connect the stacked plates in series.

3. A delay line as claimed in claim 1, further comprising conducting connecting portions formed separately from said parallel stacked plates, the connecting portions being fixedly attached to adjacent stacked plates to thereby connect said stacked plates in series.

4. A delay line as claimed in claim 1, wherein said ground electrode comprises a conducting sheet which is essentially parallel to said stacked plates, said conducting sheet having a plurality of slits formed therein.

5. A delay line as claimed in claim 2, wherein said elongated strip has a first edge and a second edge, said conducting portions being defined by a first set of conducting portions and a second set of conducting portions, the first set of conducting portions having a cut out portion along said first edge and the second set of conducting portions having a cut out portion along said second edge.

6. A distributed constant type delay line comprising:

(a) an inductance element comprising a plurality of essentially parallel stacked plates which are conducting and connected in series, said stacked plates being defined by a first and a second set of plates, individual plates of said first set of plates being stacked to alternate with individual plates of said second set of plates, each of said stacked plates having a longitudinal axis, the longitudinal axes of the first set of plates defining a first plane essentially perpendicular to the parallel stacked plates, the longitudinal axes of the second set of plates defining a second plane essentially perpendicular to the parallel stacked plates, said first plane being spaced from said second plane;

(b) a ground electrode interposed between adjacent parallel stacked plates;

(c) a dielectric layer interposed between said ground electrode and said parallel stacked plates; and (d) wherein the individual plates of said first set of plates have a cut out portion in one edge thereof, and the individual plates of said second set of plates have a cut out portion in the opposite edge thereof.

7. A distributed constant type delay line, comprising:

(a) an inductance element comprising a plurality of essentially parallel stacked plates which are conducting and connected in series, each of said stacked plates having a top edge and a bottom edge, said stacked plates being defined by a fist and a second set of plates, the individual plates of said first set of plates being stacked to alternate with the individual plates of said second set of plates, wherein (i) each of said first set of plates has a slit extending from the top edge thereof, said slits delimiting a conducting portion in each of said first set of plates, each conducting portion having a longitudinal axis, the longitudinal axes of the conducting portions of the first set of plates defining a first plane essentially perpendicular to said parallel stacked plates, (ii) each of said second set of plates has a slit extending from the bottom edge thereof, said slits delimiting a conducting portion in each of said second set of plates, each conducting portion having a longitudinal axis, the longitudinal axes of the conducting portions of the second set of plates defining a second plane essentially perpendicular to said parallel stacked plates, and (iii) said first plane is spaced from said second plane;

(b) a ground electrode interposed between adjacent parallel stacked plates; and (c) a dielectric layer interposed between said ground electrode and said parallel stacked plates.

8. A delay line as claimed in claim 7, wherein each of the slits formed in each of said first and second set of plates also delimits a flap which acts as a capacitance compensating electrode.

9. A delay line as claimed in claim 7, wherein the slits formed in each of said first and second set of plates are L-shaped.

10. A delay line as claimed in claim 7, wherein the slits formed in each of said first and second set of plates are T-shaped.

11. A delay line as claimed in claim 1, further comprising a plurality of ground electrodes, one ground electrode being interposed betweem each adjacent pair of parallel stacked plates.

12. A distributed constant type delay line, comprising:

(a) an inductance element comprising a plurality of essentially parallel stacked plates which are conducting and connectd in series, each of said stacked plates comprising a conducting portion and a capacitance compensating electrode attached thereto, said conducting portion having a longitudinal axis, said stacked plates being defined by a first and a second set of plates, individual plates of said first set of plates being stacked to alternate with individual plates of said second set of plates, wherein (i) the longitudinal axes of the conducting portions of said first set of plates define a first plane essentially perpendicular to the parallel stacked plates, (ii) the longitudinal axes of the conducting portions of said second set of plates define a second plane essentially perpendicular to the parallel stacked plates, and (iii) said first plane is spaced apart from said second plane;

(b) a ground electrode interposed between adjacent stacked plates, said ground electrode opposing one of said capacitance compensating electrodes; and (c) a dielectric layer interposed between said ground electrode and said parallel stacked plates.

13. A distributed constant delay line, comprising:

(a) an inductance element comprising a plurality of essentially parallel stacked plates which are conducting and connected in series, each of said stacked plates comprising a conducting portion and a capacitance compensating electrode attached thereto, said conducting portion having a longitudinal axis and being largely separated from said capacitance compensating electrode by a slit formed in said each of said stacked plates, said stacked plates being defined by a first and a second set of plates, individual plates of said first set of plates being stacked to alternate with individual plates of said second set of plates, wherein (i) the longitudinal axes of the conducting portions of said first set of plates define a first plane essentially perpendicular to the parallel stacked plates, (ii) the longitudinal axes of the conducting portions of said second set of plates define a second plane essentially perpendicular to the parallel stacked plates, and (iii) said first plane is spaced apart from said second plane;

(b) a ground electrode interposed between adjacent stacked plates, said ground electrode opposing one of said capacitance compensating electrodes; and (c) a dielectric layer interposed between said ground electrode and said parallel stacked plates.

14. A delay line as claimed in claim 13, wherein each of said stacked plates further comprises a top edge and a bottom edge, the slits formed in said first set of plates extending from the top edge thereof, and the slits formed in said second set of plates extending from the bottom edge thereof.

15. A delay line as claimed in claim 13, wherein each of said stacked plates has a plurality of slits formed therein which largely separate the conducting portion thereof from a plurality of capacitance compensating electrodes.

16. A delay line as claimed in claim 13, wherein said inductance element is formed from an elongated strip having a top edge and a bottom edge, said elongated strip being defined by plate portions and connecting portions, said strip being folded along lines essentially perpendicular to the longitudinal axis of said elongated strip between the plate portions and the connecting portions, so that said plate portions form said parallel stacked plates, and said connecting portions connect the stacked plates in series.

17. A delay lines claimed in claim 16, wherein each of said first set of plates has a slit formed therein which extends to the top edge of the elongated strip, and each of said second plates has a slit formed therein which extends to the bottom edge of the elongated strip.

18. A delay line as claimed in claim 13, wherein the slits in said stacked plates are L-shaped.

19. A delay line as claimed in claim 13, wherein the slits in said stacked plats are T-shaped.

20. A delay line as claimed in claim 13, wherein each of said stacked plates further comprises a top edge and a bottom edge, each of said stacked plates having a T-shaped slit extending a predetermined distance from said top edge and a second T-shaped slit extending a different predetermined distance from the bottom edge.

21. A delay line as claimed in claim 13, wherein each of said stacked plates further comprises a top edge and a bottom edge, each of said first set of plates having a T-shaped slit which extends a first predetermined distance from the top edge and a second T-shaped slit which extends a second predetermined distance from the bottom edge, said second set of plates having a T-shaped slit which extends said first predetermined distance from the bottom edge, and a second T-shaped slit which extends said second predetermined distance from the top edge.

* * * * *